United States Patent
Kim

(10) Patent No.: US 8,446,754 B2
(45) Date of Patent: May 21, 2013

(54) SEMICONDUCTOR MEMORY APPARATUS AND METHOD OF DRIVING THE SAME

(75) Inventor: Mi Jung Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 72 days.

(21) Appl. No.: 13/219,654

(22) Filed: Aug. 27, 2011

(65) Prior Publication Data

US 2012/0140544 A1    Jun. 7, 2012

(30) Foreign Application Priority Data

Dec. 7, 2010   (KR) .................. 10-2010-0124196

(51) Int. Cl.
*G11C 11/00* (2006.01)

(52) U.S. Cl.
USPC .......... 365/148; 365/189.09; 365/189.11; 365/201; 365/189.07

(58) Field of Classification Search
USPC .......... 365/148, 100, 189.09, 189.11, 201, 365/210.12, 189.07; 257/E45.002, 4
See application file for complete search history.

(56) References Cited

U.S. PATENT DOCUMENTS

2008/0239839 A1*  10/2008  Fasoli et al. .............. 365/189.11

FOREIGN PATENT DOCUMENTS

| KR | 1020070007739 A | 1/2007 |
| KR | 1020070028073 A | 3/2007 |
| KR | 1020080009029 A | 1/2008 |
| KR | 1020080052640 A | 2/2008 |

OTHER PUBLICATIONS

Mijung Kim, Unipolar Memory Operation of Resistance Random-Access Memory Using Compliance Current Controller, Japanese Journal of Applied Physics, 2009, 48.

\* cited by examiner

*Primary Examiner* — Thong Q Le
(74) *Attorney, Agent, or Firm* — William Park & Associates Patent Ltd.

(57) ABSTRACT

A semiconductor memory apparatus includes a resistive memory cell configured to be applied with a command voltage pulse with a different voltage level, depending upon an input command, and a feedback unit coupled between one end and the other end of the resistive memory cell, and configured to detect whether an amount of current which passes through the resistive memory cell reaches a target level and selectively form a pull-down current path for limiting an amount of current which the resistive memory cell passes, wherein the feedback unit controls the target level according to the command voltage pulse.

29 Claims, 6 Drawing Sheets

| V_PULSE | 2.7V (W) | 1.1V (R) | 0.7V (E) | 1.1V (R) |
|---|---|---|---|---|
| S | 0 | 1 | 1 | 1 |
| R | 1 | 1 | 0 | 1 |
| Q | 1 | 1 | 0 | 0 |
| QB (CTRL_I) | 0 | 0 | 1 | 1 |

W : WRITE
E : ERASE
R : READ

*VREF3=2.1V
VREF4=0.9V

W : WRITE    RCC : RESET COMPLIANCE CURRENT
E : ERASE    SCC : SET COMPLIANCE CURRENT
R : READ

W : WRITE
E : RESET
R : READ
RCC : RESET COMPLIANCE CURRENT
SCC : SET COMPLIANCE CURRENT

SEMICONDUCTOR MEMORY APPARATUS AND METHOD OF DRIVING THE SAME

CROSS-REFERENCES TO RELATED APPLICATION

The present application claims priority under 35 U.S.C. §119(a) to Korean application number 10-2010-0124196, filed on Dec. 7, 2010, in the Korean Intellectual Property Office, which is incorporated herein by reference in its entirety.

BACKGROUND

1. Technical Field

The present invention relates to a semiconductor memory apparatus, and more particularly, to a technology for driving a resistive memory apparatus having a unipolar switching characteristic.

2. Related Art

In next-generation memories which are currently developed, attempts are being made to combine the advantages of the high integration degree and low power consumption of a DRAM, the non-volatility of a flash memory and the high speed operation of an SRAM. In particular, an RRAM, having a structure in which a substance for allowing resistive switching is interposed between a bottom electrode and a top electrode, uses a phenomenon in which a current path is formed and resistance decreases in the substance by applying a sufficiently high voltage to the substance. In the RRAM, once the current path is formed, by applying an appropriate voltage, it is possible to remove the current path or regenerate the current path. Currently, RRAMs using various substances such as perovskite, a transition metal oxide and chalcogenide are being developed.

SUMMARY

In an exemplary embodiment of the present invention, a semiconductor memory apparatus includes a resistive memory cell configured to be applied with a command voltage pulse with a different voltage level, depending upon an input command, and a feedback unit coupled between one end and the other end of the resistive memory cell, and configured to detect whether an amount of current which passes through the resistive memory cell reaches a target level and selectively form a pull-down current path for limiting an amount of current which the resistive memory cell passes, wherein the feedback unit controls the target level according to the command voltage pulse.

In another exemplary embodiment of the present invention, a semiconductor memory apparatus includes a resistive memory cell configured to be applied with a command voltage pulse with a different voltage level, depending upon an input command, a current control signal generation unit configured to detect a voltage level of the command voltage pulse and output a detection result as a current control signal, and a feedback unit coupled between one end and the other end of the resistive memory cell, and configured to detect whether an amount of current which passes through the resistive memory cell reaches a target level and selectively form a pull-down current path for limiting an amount of current which the resistive memory cell passes, wherein the feedback unit controls the target level under the control of the current control signal.

In another exemplary embodiment of the present invention, a semiconductor memory apparatus includes a resistive memory cell configured to be applied with a command voltage pulse with a different voltage level, depending upon an input command, a current control signal generation unit configured to detect a voltage level of the command voltage pulse and output a detection result as a current control signal, a compliance current control section configured to detect a formation voltage formed by current which the resistive memory cell passes, based on a first reference voltage and a second reference voltage with a voltage level lower than the first reference voltage, selectively form the pull-down current path according to a detection result, and thereby limit an amount of current which the resistive memory cell passes, and a reference voltage control section configured to raise the voltage level of the second reference voltage higher than a voltage level of the first reference voltage in response to the current control signal.

In another exemplary embodiment of the present invention, a method for driving a semiconductor memory apparatus having a resistive memory cell which performs a unipolar switching operation by receiving a command voltage pulse with a different voltage level depending upon an input command includes the steps of setting a maximum amount of current which the resistive memory cell can pass, as a first compliance current, performing a data writing operation by applying a writing voltage pulse to the resistive memory cell, and performing a first data verifying operation by applying a reading voltage pulse to the resistive memory cell and sensing an electrical state of the resistive memory cell.

BRIEF DESCRIPTION OF THE DRAWINGS

Features, aspects, and embodiments are described in conjunction with the attached drawings, in which.

DETAILED DESCRIPTION

Figure 1:
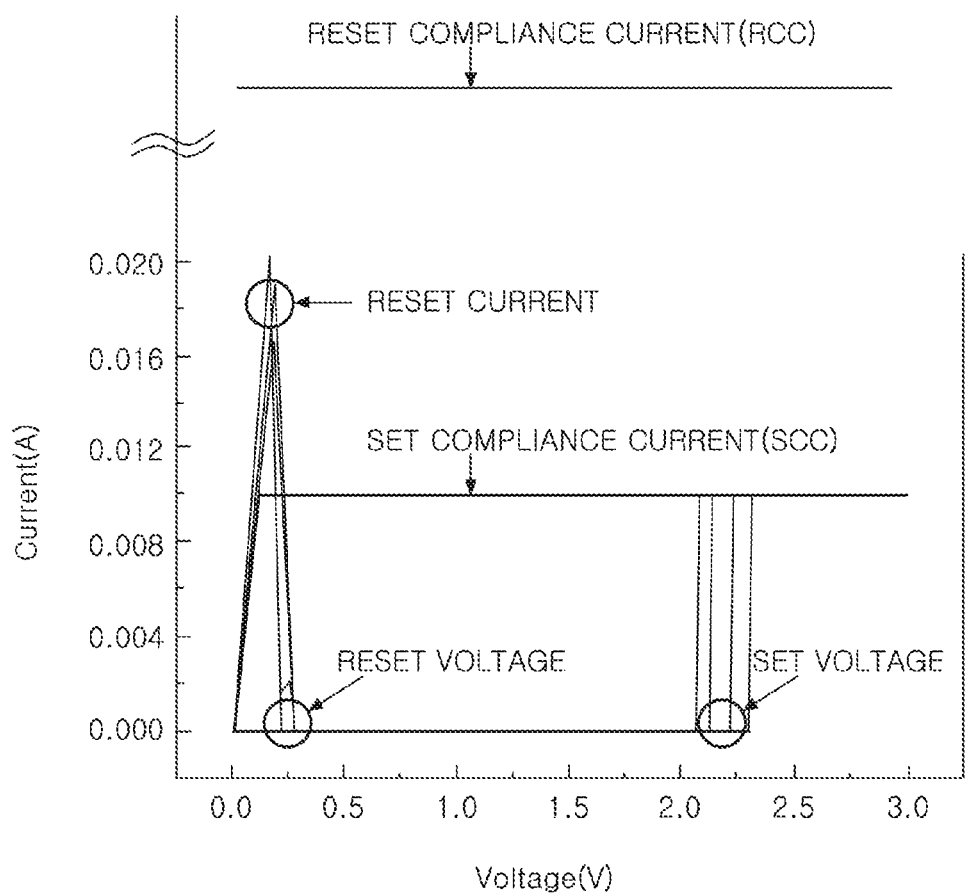
FIG. 1 is a graph showing a unipolar switching characteristic of a resistive memory cell in accordance with an exemplary embodiment of the present invention.

Hereinafter, a semiconductor memory apparatus and a method of driving the same according to the present invention will be described below with reference to the accompanying drawings through exemplary embodiments.

For reference, since terms, symbols and signs that are used in drawings and in this detailed description to designate devices, blocks, and so on may be used for detailed units as the occasion demands, it is to be noted that the same terms, symbols and signs may not designate the same devices, blocks, and so on in an entire circuitry. Also, the logic signals of a circuit and binary data values are divided into a high level (H) or a low level (L) in correspondence to voltage levels and may be represented as '1' and '0'. Furthermore, as the occasion demands, a high impedance state (a high-Z state) may be defined and described.

Resistive memory cells may be manufactured to have two types of switching characteristics including bipolar switching and unipolar switching.

First, in a bipolar switching operation, a resistive memory cell is converted into a turned-on state or a turned-off state depending upon which of a positive voltage and a negative voltage is applied. For example, if the positive voltage is applied, the state of the resistive memory cell becomes the turned-on state. Also, if the negative voltage is applied, the state of the resistive memory cell becomes the turned-off state. Here, the turned-on state of the resistive memory cell may be defined as a state having a relatively low resistance value compared to the turned-off state. The turned-on state of the resistive memory cell may also be called a set state, and the turned-off state of the resistive memory cell may also be called a reset state.

Next, in a unipolar switching operation, unlike the bipolar switching operation, a maximum amount of current for a write operation which the resistive memory cell can pass is set. Here, the maximum amount of current may be called as a first compliance current or a set compliance current, and the resistive memory cell in the turned-on state is controlled to pass only an amount of current corresponding to the set compliance current at the maximum. In the write operation, as a writing voltage pulse rises from a ground voltage to a positive voltage level and reaches a set voltage (i.e., a voltage for the resistive memory cell to become the set state), the resistive memory cell becomes turned on. Here, current, which passes through the resistive memory cell, is limited to the set compliance current.

Further, a maximum amount of current for an erase operation which the resistive memory cell can pass is set. Here, the maximum amount of current may be called as a second compliance current or a reset compliance current, and the resistive memory cell in the turned-off state is controlled to pass only an amount of current corresponding to the reset compliance current at the maximum. In order to convert the resistive memory cell from the turned-on state into the turned-off state, an erasure voltage pulse rises from the ground voltage to a positive voltage level and reaches a reset voltage, the current, which passes through the resistive memory cell, become momentarily higher than the set compliance current and then decreases quickly, and the resistive memory cell becomes turned off. Here, current, which passes through the resistive memory cell, is limited to the reset compliance current. Such a unipolar switching characteristic of the resistive memory cell occurs symmetrically in a negative voltage direction as well as in a positive voltage direction. Such a reversible change between the turned-off state and the turned-on state may be explained by a conductive filament theory.

In summary, switching operations are induced through operations of applying a writing voltage pulse or an erasure voltage pulse in a state in which the set compliance current or the reset compliance current is set. The resistance value of the resistive memory cell, i.e., the set state or the reset state is continuously maintained even though power is off.

FIG. 1 is a graph showing a unipolar switching characteristic of a resistive memory cell in accordance with an exemplary embodiment of the present invention.

Referring to FIG. 1, initially, a resistive memory cell is in a turned-off state and has a high resistance value. If the voltage applied to the resistive memory cell is raised from a ground voltage to 3V, current quickly increases at approximately 2.2V, and the resistive memory cell is converted into a turned-on state. The resistive memory cell in the turned-on state has a relatively very low resistance value compared to the turned-off state.

An amount of current, which the resistive memory cell can pass when the resistive memory cell is converted from the turned-off state into the turned-on state, is limited up to a set compliance current. Also, an amount of current, which the resistive memory cell can pass when the resistive memory cell is converted from the turned-on state into the turned-off state, is limited up to a reset compliance current. For reference, current needed when the resistive memory cell is converted from the turned-on state into the turned-off state will be referred to as a reset current.

If the voltage applied to the resistive memory cell in the turned-on state is raised from the ground voltage to 1V, current flow reaches the reset current and then decreases quickly at approximately 0.3V. This means that the resistive memory cell is converted into the turned-off state as a resistance value increases.

Figure 2:
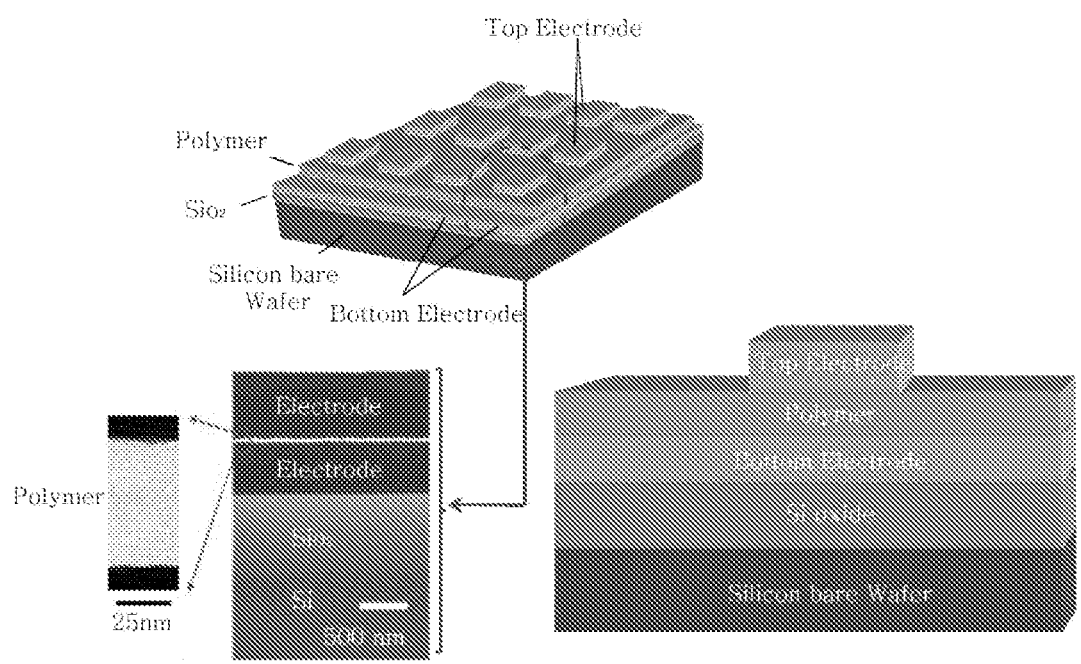
FIG. 2 is a view illustrating the structure of the resistive memory cell in accordance with the exemplary embodiment of the present invention.

FIG. 2 is a view illustrating the structure of the resistive memory cell in accordance with the exemplary embodiment of the present invention.

Referring to FIG. 2, in the resistive memory cell, a polymer substance with a unipolar switching characteristic is interposed between a bottom electrode and a top electrode. The polymer substance may include any one of PI-DPC, PI-carbazol, and PEDOT:PSS.

Figure 3:
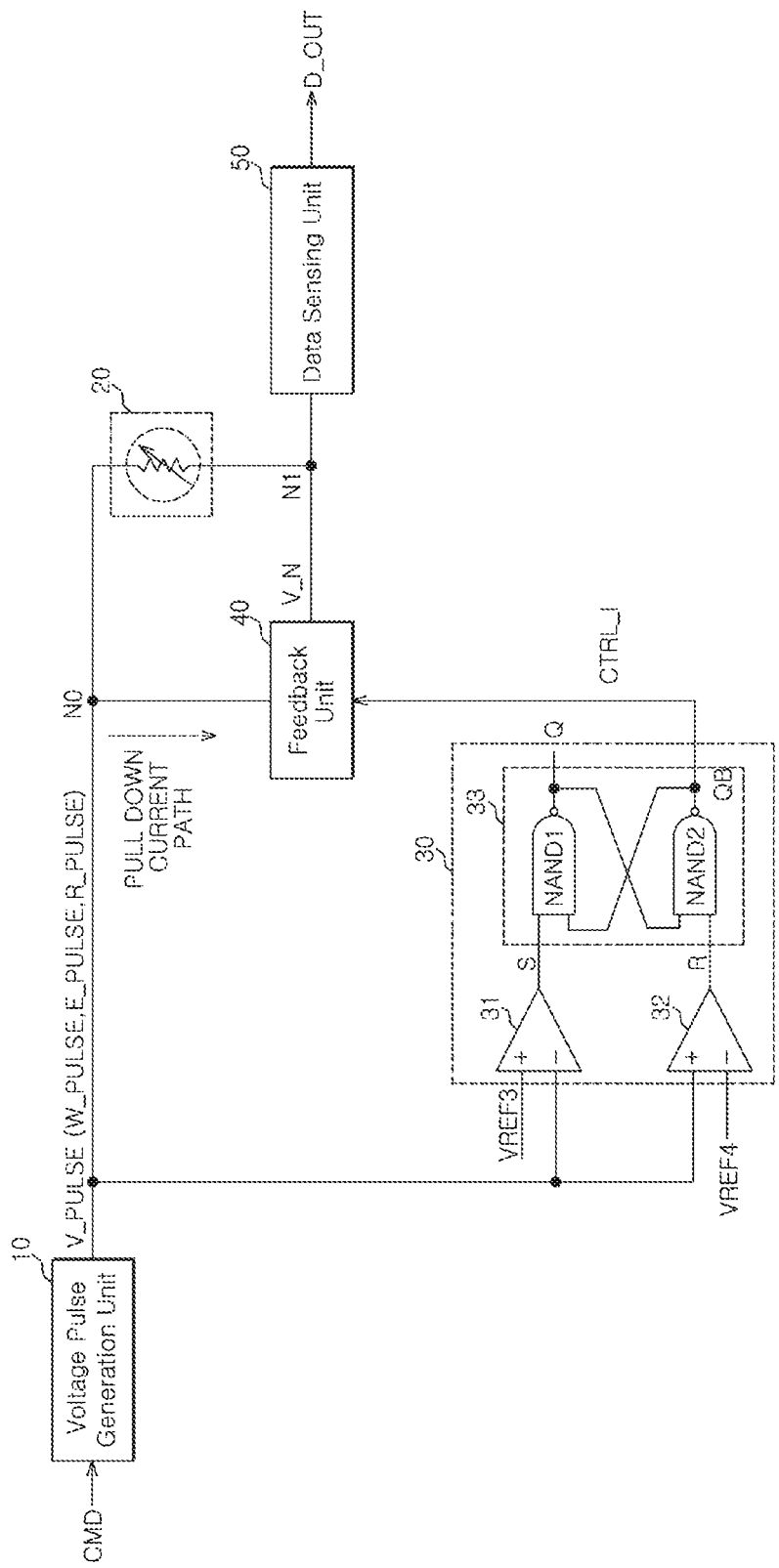
FIG. 3 is a configuration diagram of a semiconductor memory apparatus in accordance with another exemplary embodiment of the present invention.

FIG. 3 is a configuration diagram of a semiconductor memory apparatus in accordance with another exemplary embodiment of the present invention.

The semiconductor memory apparatus in accordance with this exemplary embodiment of the present invention includes only a simplified configuration for the sake of clear description of the exemplary embodiment.

Referring to FIG. 3, a semiconductor memory apparatus includes a voltage pulse generation unit 10, a resistive memory cell 20, a current control signal generation unit 30, a feedback unit 40, and a data sensing unit 50.

The detailed configuration and the principal operations of the semiconductor memory apparatus configured as mentioned above will be described below.

The voltage pulse generation unit 10 is configured to receive an input command CMD and generate a command voltage pulse V_PULSE which includes a writing voltage pulse W_PULSE, an erasure voltage pulse E_PULSE and a reading voltage pulse R_PULSE. In other words, the voltage pulse generation unit 10 outputs the writing voltage pulse W_PULSE with a first voltage level if a data writing command is inputted, outputs the erasure voltage pulse E_PULSE with a second voltage level if a data erasure command is inputted, and outputs the reading voltage pulse R_PULSE with a third voltage level if a data reading command is inputted. Here, it may be defined that the first voltage level is higher than the third voltage level and the second voltage level is lower than the third voltage level.

The resistive memory cell 20 is configured to receive the command voltage pulse V_PULSE which has a different voltage level depending upon the input command CMD. The resistive memory cell 20 may be defined as a device which has a unipolar switching characteristic.

The feedback unit 40 is coupled between one end N0 and the other end N1 of the resistive memory cell 20. The feedback unit 40 detects whether an amount of current which passes through the resistive memory cell 20 reaches a target level, and selectively forms a pull-down current path PULL DOWN CURRENT PATH for limiting an amount of current which the resistive memory cell 20 passes, according to a detection result.

In this exemplary embodiment of the present invention, the current control signal generation unit 30 is configured to detect the voltage level of the command voltage pulse V_PULSE and outputs a detection result as a current control signal CTRL_I. Accordingly, since the feedback unit 40 controls the target level under the control of the current control signal CTRL_I, it may be mentioned that the target level is controlled depending upon which command voltage pulse V_PULSE is inputted. The control of the target level means that it is possible to control a limit level in amount of current which the resistive memory cell 20 passes.

The feedback unit 40 limits a maximum amount of current, which the resistive memory cell 20 can pass in a first operation cycle in which the data writing command is inputted, for example, in which the data writing command and the data reading command are sequentially inputted, to a first compliance current. Also, the feedback unit 40 limits a maximum amount of current, which the resistive memory cell 20 can pass in a second operation cycle in which the data erasure command is inputted, for example, in which the data erasure command and the data reading command are sequentially inputted, to a second compliance current with a level higher than the first compliance current. Here, the data reading command may be a verifying command (i.e., a command for verifying whether a write operation or erase operation is completed).

Therefore, during the first operation cycle, if the writing voltage pulse W_PULSE is inputted, for example, if the writing voltage pulse W_PULSE and the reading voltage pulse R_PULSE, in response to the data writing command and the data reading command, are sequentially inputted, the resistive memory cell 20 in a turned-off state is converted into a turned-on state, and a resistance value becomes low.

Also, during the second operation cycle, if the erasure voltage pulse E_PULSE is inputted, for example, if the erasure voltage pulse E_PULSE and the reading voltage pulse R_PULSE, in response to the data erasure command and the data reading command, are sequentially applied, the resistive memory cell 20 in the turned-on state is converted back into the turned-off state, and a resistance value become high.

In this exemplary embodiment, the current control signal generation unit 30 includes comparison sections 31 and 32 and an RS latch section 33.

The comparison sections 31 and 32 are configured to compare the voltage levels of third and fourth reference voltages VREF3 and VREF4 with the command voltage pulse V_PULSE respectively, and output comparison results as first and second comparison result signals S and R. The RS latch section 33 is configured to selectively output the current control signal CTRL_I in response to the first and second comparison result signals S and R.

The data sensing section 50 is configured to sense an amount of current which passes through the resistive memory cell 20 and output output data D_OUT in response to the data reading command. Namely, if the resistive memory cell 20 is in the turned-on state (that is, the set state), since a resistance value is small, a large amount of current flows. Moreover, if the resistive memory cell 20 is in the turned-off state (that is, the reset state), since a resistance value is large, no substantial current flows (very small current may flow). The data sensing section 50 senses a change in current amount, and outputs the output data D_OUT according to a sensing result.

Figure 4:
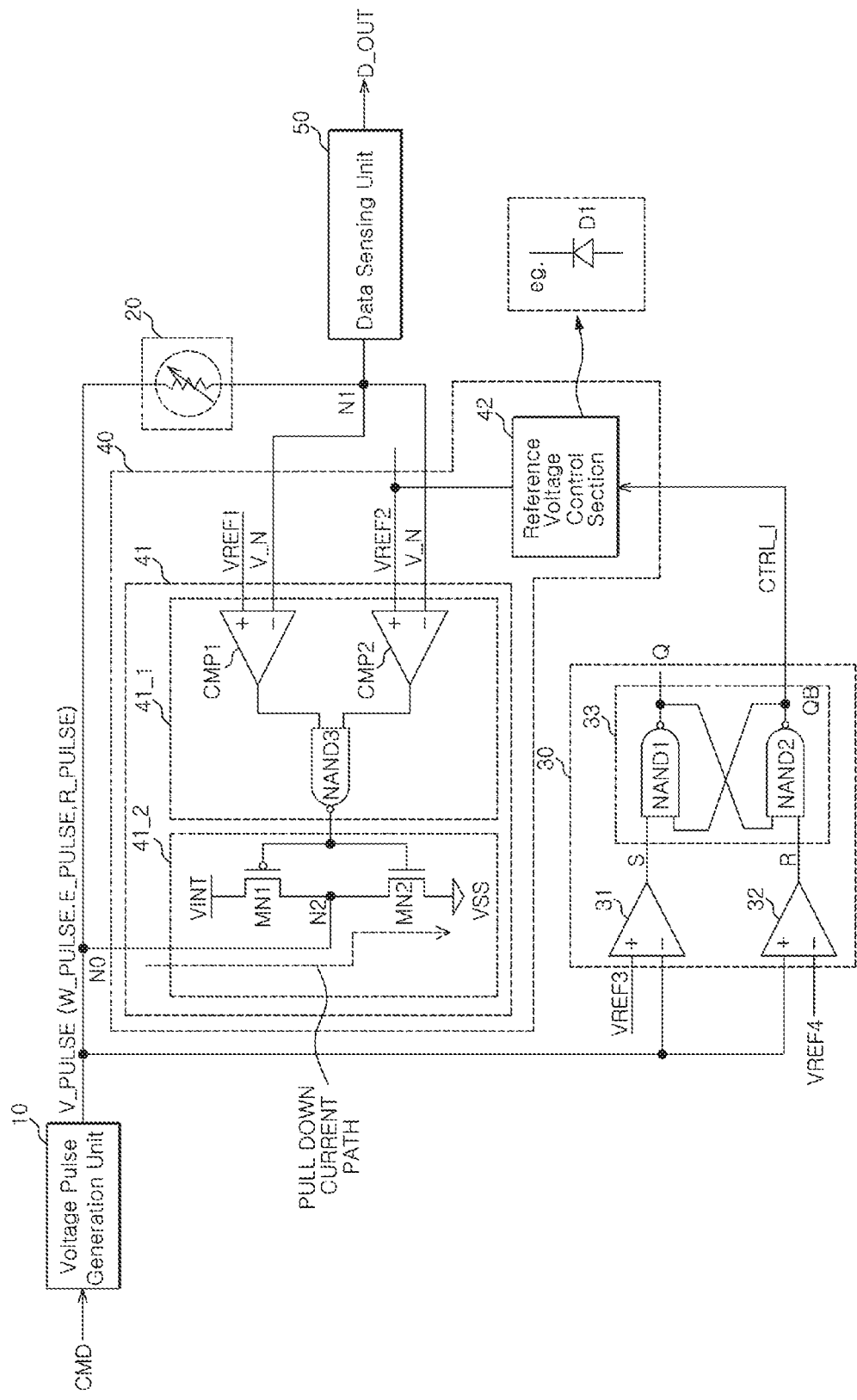
FIG. 4 is a view illustrating a detailed exemplary embodiment of the semiconductor memory apparatus shown in FIG. 3.

FIG. 4 is a view illustrating a detailed exemplary embodiment of the semiconductor memory apparatus shown in FIG. 3.

The semiconductor memory apparatus in accordance with this exemplary embodiment of the present invention includes only a simplified configuration for the sake of clear description of the exemplary embodiment.

Referring to FIG. 4, a semiconductor memory apparatus includes a voltage pulse generation unit 10, a resistive memory cell 20, a current control signal generation unit 30, a feedback unit 40, and a data sensing unit 50.

The detailed configuration and the principal operations of the semiconductor memory apparatus configured as mentioned above will be described below.

The voltage pulse generation unit 10 is configured to receive an input command CMD and generate a command voltage pulse V_PULSE which includes a writing voltage pulse W_PULSE, an erasure voltage pulse E_PULSE and a reading voltage pulse R_PULSE. In other words, the voltage pulse generation unit 10 outputs the writing voltage pulse W_PULSE with a first voltage level if a data writing command is inputted, outputs the erasure voltage pulse E_PULSE with a second voltage level if a data erasure command is inputted, and outputs the reading voltage pulse R_PULSE with a third voltage level if a data reading command is inputted. Here, it may be defined that the first voltage level is higher than the third voltage level and the second voltage level is lower than the third voltage level.

The resistive memory cell 20 is configured to receive the command voltage pulse V_PULSE which has a different voltage level depending upon the input command CMD. The resistive memory cell 20 may be defined as a device which has a unipolar switching characteristic.

The current control signal generation unit 30 is configured to detect the voltage level of the command voltage pulse V_PULSE and outputs a detection result as a current control signal CTRL_I. In this exemplary embodiment, the current control signal generation unit 30 includes comparison sections 31 and 32 and an RS latch section 33. The comparison sections 31 and 32 are configured to compare the voltage levels of third and fourth reference voltages VREF3 and VREF4 with the command voltage pulse V_PULSE respectively, and output comparison results as first and second comparison result signals S and R. The RS latch section 33 is configured to selectively output the current control signal CTRL_I in response to the first and second comparison result signals S and R.

The feedback unit 40 is coupled between one end N0 and the other end N1 of the resistive memory cell 20. The feedback unit 40 detects whether an amount of current which passes through the resistive memory cell 20 reaches a target level, and selectively forms a pull-down current path PULL DOWN CURRENT PATH for limiting an amount of current which the resistive memory cell 20 passes, according to a detection result. The feedback unit 40 controls the target level under the control of the current control signal CTRL_I. The control of the target level means that it is possible to control a limit level in amount of current which the resistive memory cell 20 passes.

In this exemplary embodiment, the feedback unit 40 includes a compliance current control section 41 and a reference voltage control section 42.

In this exemplary embodiment, the compliance current control section 41 includes a comparison stage 41-1 configured to compare first and second reference voltages VREF1 and VREF2 with a formation voltage V_N respectively, and a pull-up/pull-down driving stage 41-2 configured to selectively form a pull-up/pull-down current path according to the comparison result of the comparison stage 41-1.

The compliance current control section 41 is configured to detect the formation voltage V_N formed by the current which the resistive memory cell 20 passes, based on the first reference voltage VREF1 and the second reference voltage VREF2 with a voltage level lower than the first reference voltage VREF1, and selectively form a pull-down current path PULL DOWN CURRENT PATH on the one end N0 of the resistive memory cell 20 according to a detection result. If the pull-down current path PULL DOWN CURRENT PATH is formed, an amount of current, which the resistive memory cell 20 passes, is limited. In this exemplary embodiment, the pull-down current path PULL DOWN CURRENT PATH is formed from when the formation voltage V_N becomes higher than the second reference voltage VREF2.

Also, in this exemplary embodiment, the reference voltage control section 42 may include a diode D1 having an anode which receives the current control signal CTRL_I and a cathode which is connected to the input node of the second reference voltage VREF2. Thus, when the current control signal CTRL_I has a low level, since the diode D1 is turned off, the second reference voltage VREF2 maintains an existing level. When the current control signal CTRL_I has a high level, since the diode D1 is turned on, the second reference voltage VREF2 rises higher than the existing level and becomes higher than the first reference voltage VREF1.

The compliance current control section 41 limits a maximum amount of current which the resistive memory cell 20 can pass in a first operation cycle in which the data writing command is inputted, for example, in which the data writing command and a data reading command are sequentially inputted, to a first compliance current. Also, the compliance current control section 41 limits a maximum amount of current which the resistive memory cell 20 can pass in a second operation cycle in which the data erasure command is inputted, for example, in which the data erasure command and the data reading command are sequentially inputted, to a second compliance current with a level higher than the first compliance current. Here, the data reading command may be a verifying command (i.e., a command for verifying whether a write operation or erase operation is completed).

Accordingly, during the first operation cycle, if the writing voltage pulse W_PULSE is inputted, for example, if the writing voltage pulse W_PULSE and the reading voltage pulse R_PULSE, in response to the data writing command and the data reading command, are sequentially inputted, the resistive memory cell 20 in a turned-off state is converted into a turned-on state, and a resistance value becomes low.

Also, during the second operation cycle, if the erasure voltage pulse E_PULSE is inputted, for example, if the erasure voltage pulse E_PULSE and the reading voltage pulse R_PULSE, in response to the data erasure command and the data reading command, are sequentially inputted, the resistive memory cell 20 in the turned-on state is converted back into the turned-off state, and a resistance value become high.

The reference voltage control section 42 raises the voltage level of the second reference voltage VREF2 to a voltage level higher than the voltage level of the first reference voltage VREF1 in response to the current control signal CTRL_I. If the voltage level of the first reference voltage VREF1 is higher than the voltage level of the second reference voltage VREF2, the pull-down current path PULL DOWN CURRENT PATH may be formed from when the formation voltage V_N becomes higher than the second reference voltage VREF2. Further, If the voltage level of the second reference voltage VREF2 becomes higher than the voltage level of the first reference voltage VREF1, the pull-down current path PULL DOWN CURRENT PATH may be formed from when the formation voltage V_N becomes higher than the first reference voltage VREF1.

If the current control signal CTRL_I has the low level, the compliance current control section 41 of the feedback unit 40 may form the pull-down current path PULL DOWN CURRENT PATH when an amount of current, which passes through the resistive memory cell 20, reaches a first target level. If the current control signal CTRL_I has the high level, the compliance current control section 41 of the feedback unit 40 may form the pull-down current path PULL DOWN CURRENT PATH when an amount of current, which passes through the resistive memory cell 20, reaches a second target level higher than the first target level.

The data sensing section 50 is configured to sense an amount of current which passes through the resistive memory cell 20, and output output data D_OUT. Namely, if the resistive memory cell 20 is in the turned-on state (that is, the set state), since a resistance value is small, a large amount of current flows. Moreover, if the resistive memory cell 20 is in the turned-off state (that is, the reset state), since a resistance value is very large, no substantial current flows (very small current may flow). The data sensing section 50 senses a change in current amount, and outputs the output data D_OUT according to a sensing result.

Figures 5, 6:
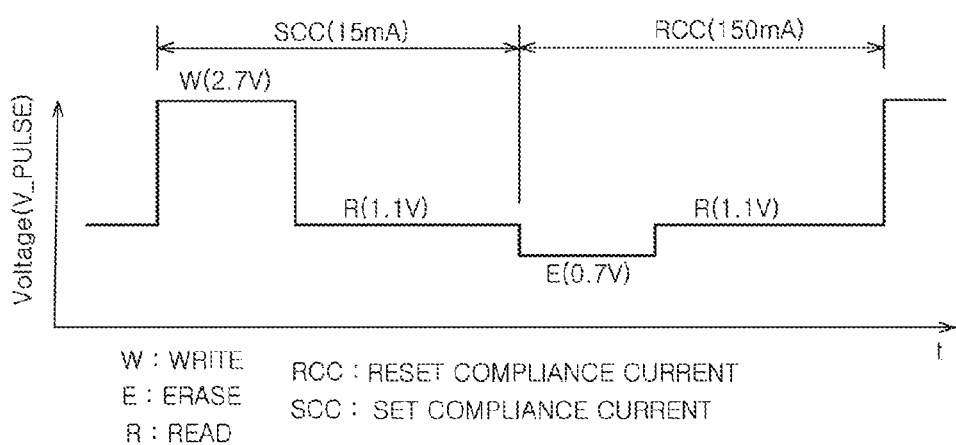
FIG. 5 is a truth table showing the internal operations of the current control signal generation unit shown in FIG. 3.
FIG. 6 is a graph showing respective command voltage pulses and compliance currents for controlling the semiconductor memory apparatus in accordance with the exemplary embodiment of the present invention.

FIG. 5 is a truth table showing the internal operations of the current control signal generation unit shown in FIG. 3.

The truth table of FIG. 5 represents a case in which the writing voltage pulse W_PULSE, the reading voltage pulse R_PULSE, the erasure voltage pulse E_PULSE and the reading voltage pulse R_PULSE are sequentially applied and thereby writing, reading, erasure and reading cycles continuously occur.

According to an example, in the first operation cycle in which the writing voltage pulse W_PULSE and the reading voltage pulse R_PULSE are sequentially inputted, since the current control signal CTRL_I maintains the low level, a set compliance current is set.

Next, in the second operation cycle in which the erasure voltage pulse E_PULSE and the reading voltage pulse R_PULSE are sequentially inputted, since the current control signal CTRL_I maintains the high level, a reset compliance current with a level higher than the set compliance current is set.

Figure 7:
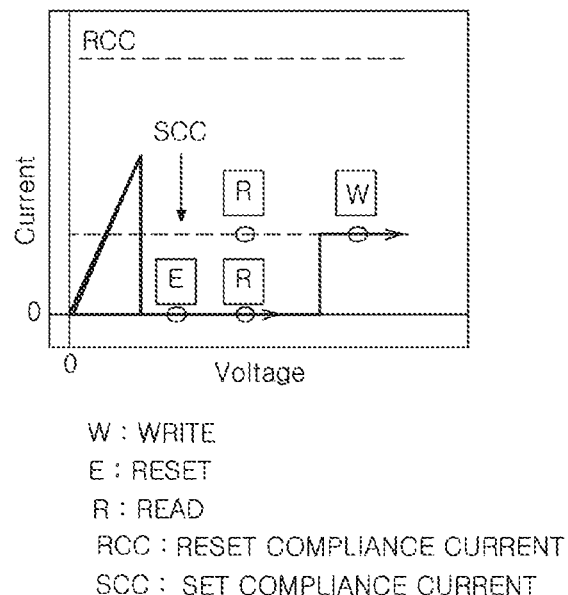
FIG. 7 is a graph showing the switching operations of a memory cell according to data writing, data reading and data erasure operations.

FIG. 6 is a graph showing respective command voltage pulses and compliance currents for controlling the semiconductor memory apparatus in accordance with the exemplary embodiment of the present invention, and FIG. 7 is a graph showing the switching operations of a memory cell according to data writing, data reading and data erasure operations.

With reference to FIGS. 6 and 7 together, operations in the case where the data writing command, the data reading command, the data erasure command and the data reading command are sequentially applied and thereby the writing, reading, erasure and reading cycles continuously occur will be described below.

First, in a state in which the set compliance current is set, the writing voltage pulse W_PULSE and the reading voltage pulse R_PULSE are sequentially applied. This may be considered as operations of storing set data in the resistive memory cell and verifying the stored data.

Next, in a state in which the reset compliance current is set, the erasure voltage pulse E_PULSE and the reading voltage pulse R_PULSE are sequentially applied. This may be considered as operations of storing reset data in the resistive memory cell and verifying the stored data.

Figure 8:
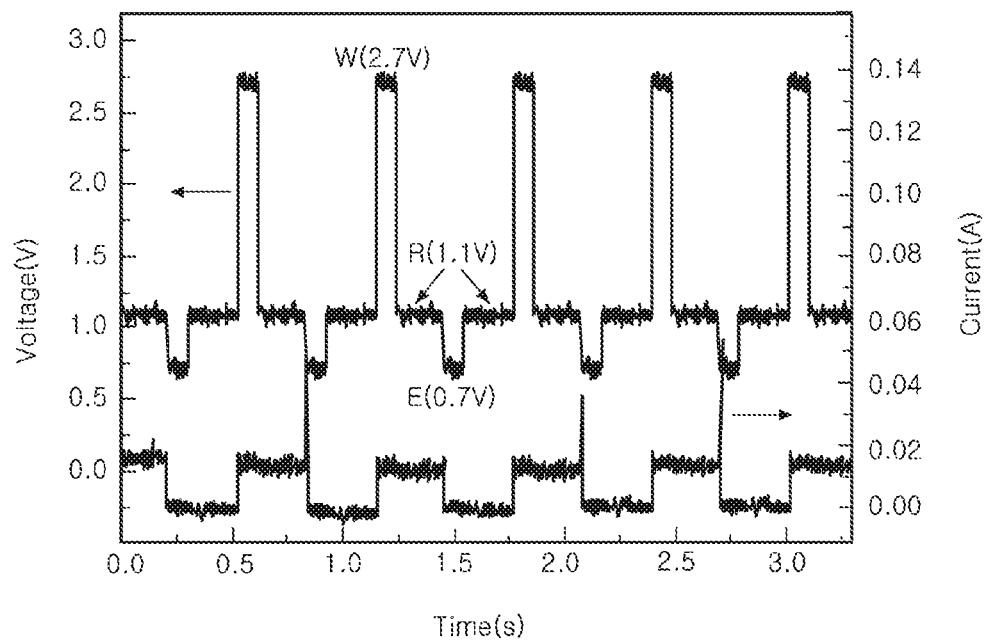
FIG. 8 is a graph showing the results of the respective operations of the semiconductor memory apparatus in accordance with the exemplary embodiment of the present invention.

FIG. 8 is a graph showing the results of the respective operations of the semiconductor memory apparatus in accordance with the exemplary embodiment of the present invention.

Referring to FIG. 8, the writing voltage pulse W_PULSE, the reading voltage pulse R_PULSE, the erasure voltage pulse E_PULSE and the reading voltage pulse R_PULSE are sequentially applied, and current flow change due to unipolar switching operations when the respective pulses are applied, in the case where the writing, reading, erasure and reading cycles sequentially proceed. If the writing voltage pulse W_PULSE is applied and the resistive memory cell is in the set state, since a resistance value becomes low, current of a certain magnitude flows when the reading voltage pulse R_PULSE is applied. Conversely, if the erasure voltage pulse E_PULSE is applied and the resistive memory cell is in the reset state, since a resistance value becomes very high, no substantial current flows (very small current may flow) when the reading voltage pulse R_PULSE is applied.

In another exemplary embodiment of the present invention, a method for driving a semiconductor memory apparatus having a resistive memory cell which performs a unipolar switching operation by receiving a command voltage pulse with a different voltage level depending upon an input command includes the steps of setting a maximum amount of current which the resistive memory cell can pass, as a first compliance current, performing a data writing operation by applying a writing voltage pulse to the resistive memory cell, performing a first data verifying operation by applying a reading voltage pulse to the resistive memory cell and sensing an electrical state of the resistive memory cell, setting a maximum amount of current which the resistive memory cell can pass, as a second compliance current with a level higher than the first compliance current, performing a data erasure operation by applying an erasure voltage pulse to the resistive memory cell, and performing a second data verifying operation by applying a reading voltage pulse to the resistive memory cell and sensing an electrical state of the resistive memory cell.

As is apparent from the above description, by the semiconductor memory apparatus and the method for driving a semiconductor memory apparatus according to the exemplary embodiments of the present invention, it is possible to efficiently drive a resistive memory cell with a unipolar switching characteristic.

So far, exemplary embodiments of the present invention have been described in detail. For reference, exemplary embodiments including additional component elements, which are not directly associated with the exemplary embodiments of the present invention, may be exemplified in order to describe the present invention in further detail. Moreover, an active high configuration or an active low configuration for indicating the activated states of signals and circuits may vary depending upon an exemplary embodiment. Furthermore, the configurations of transistors may be changed as the occasion demands in order to realize the same function. That is to say, the configurations of a PMOS transistor and an NMOS transistor may be replaced with each other, and as the occasion demands, various transistors may be employed. In addition, the configurations of logic gates may be changed as the occasion demands in order to realize the same function. That is to say, a NANDing element, a NORing element and the like may be configured through various combinations of a NAND gate, a NOR gate, an inverter, and the like. Since these embodiment changes have a large number of cases and can be easily inferred by those skilled in the art, the enumeration thereof will be omitted herein.

While certain embodiments have been described above, it will be understood to those skilled in the art that the embodiments described are by way of example only. Accordingly, the semiconductor memory apparatus and the method of driving the same described herein should not be limited based on the described embodiments. Rather, the semiconductor memory apparatus and the method of driving the same described herein should only be limited in light of the claims that follow when taken in conjunction with the above description and accompanying drawings.

What is claimed is:

1. A semiconductor memory apparatus comprising:
   a resistive memory cell configured to be applied with a command voltage pulse with a different voltage level, depending upon an input command; and
   a feedback unit coupled between one end and the other end of the resistive memory cell, and configured to detect whether an amount of current which passes through the resistive memory cell reaches a target level and selectively form a pull-down current path for limiting an amount of current which the resistive memory cell passes, wherein the feedback unit controls the target level according to the command voltage pulse.

2. The semiconductor memory apparatus according to claim 1, wherein the resistive memory cell has a unipolar switching characteristic.

3. The semiconductor memory apparatus according to claim 1, wherein the resistive memory cell has a structure in which a polymer substance with a unipolar switching characteristic is interposed between a bottom electrode and a top electrode.

4. The semiconductor memory apparatus according to claim 1, further comprising:
   a voltage pulse generation unit configured to receive the input command and generate the command voltage pulse, wherein the voltage pulse generation unit outputs a writing voltage pulse with a first voltage level if a data writing command is inputted, outputs an erasure voltage pulse with a second voltage level if a data erasure command is inputted, and outputs a reading voltage pulse with a third voltage level if a data reading command is inputted,
   wherein the first voltage level is higher than the third voltage level and the second voltage level is lower than the third voltage level.

5. The semiconductor memory apparatus according to claim 1, further comprising:
   is a data sensing unit configured to sense an amount of current which passes through the resistive memory cell and output an output data in response to the data reading command is inputted.

6. The semiconductor memory apparatus according to claim 1, wherein the feedback unit limits a maximum amount of current, which the resistive memory cell can pass in a first operation cycle in which the data writing command is inputted, to a first compliance current, and limits a maximum amount of current, which the resistive memory cell can pass in a second operation cycle in which the data erasure command is inputted, to a second compliance current with a level higher than the first compliance current.

7. A semiconductor memory apparatus comprising:
- a resistive memory cell configured to be applied with a command voltage pulse with a different voltage level, depending upon an input command;
- a current control signal generation unit configured to detect a voltage level of the command voltage pulse and output a detection result as a current control signal; and
- a feedback unit coupled between one end and the other end of the resistive memory cell, and configured to detect whether an amount of current which passes through the resistive memory cell reaches a target level and selectively form a pull-down current path for limiting an amount of current which the resistive memory cell passes, wherein the feedback unit controls the target level under the control of the current control signal.

8. The semiconductor memory apparatus according to claim 7, wherein the resistive memory cell has a unipolar switching characteristic.

9. The semiconductor memory apparatus according to claim 7, wherein the resistive memory cell has a structure in which a polymer substance with a unipolar switching characteristic is interposed between a bottom electrode and a top electrode.

10. The semiconductor memory apparatus according to claim 7, further comprising:
- a voltage pulse generation unit configured to receive the input command and generate the command voltage pulse, wherein the voltage pulse generation unit outputs a writing voltage pulse with a first voltage level if a data writing command is inputted, outputs an erasure voltage pulse with a second voltage level if a data erasure command is inputted, and outputs a reading voltage pulse with a third voltage level if a data reading command is inputted,
- wherein the first voltage level is higher than the third voltage level and the second voltage level is lower than the third voltage level.

11. The semiconductor memory apparatus according to claim 7, further comprising:
- a data sensing unit configured to sense an amount of current which passes through the resistive memory cell and output an output data in response to the data reading command is inputted.

12. The semiconductor memory apparatus according to claim 7, wherein the feedback unit limits a maximum amount of current, which the resistive memory cell can pass in a first operation cycle in which the data writing command is inputted, to a first compliance current, and limits a maximum amount of current, which the resistive memory cell can pass in a second operation cycle in which the data erasure command is inputted, to a second compliance current with a level higher than the first compliance current.

13. The semiconductor memory apparatus according to claim 7, wherein, under the control of the current control signal, the feedback unit forms the pull-down current path when an amount of current, which passes through the resistive memory cell, reaches a first target level or forms the pull-down current path when an amount of current, which passes through the resistive memory cell, reaches a second target level higher than the first target level.

14. The semiconductor memory apparatus according to claim 7, wherein the feedback unit comprises:
- a compliance current control section configured to detect a formation voltage formed by current which the resistive memory cell passes, based on a first reference voltage and a second reference voltage with a voltage level lower than the first reference voltage, selectively form the pull-down current path according to a detection result, and thereby limit an amount of current which the resistive memory cell passes; and
- a reference voltage control section configured to raise the voltage level of the second reference voltage higher than a voltage level of the first reference voltage in response to the current control signal.

15. The semiconductor memory apparatus according to claim 14, wherein the compliance current control section comprises:
- a comparison stage configured to compare the first and second reference voltages with the formation voltage respectively; and
- a pull-up/pull-down driving stage configured to selectively form a pull-up/pull-down current path according to a comparison result of the comparison stage.

16. The semiconductor memory apparatus according to claim 14, wherein the reference voltage control section comprises:
- a diode having an anode which receives the current control signal and a cathode which is coupled to an input node of the second reference voltage.

17. The semiconductor memory apparatus according to claim 7, wherein the current control signal generation unit comprises:
- comparison sections configured to compare the voltage levels of the first and second reference voltages with the command voltage pulse respectively, and output comparison results as first and second comparison result signals; and
- an RS latch section configured to output the current control signal in response to the first and second comparison result signals.

18. A semiconductor memory apparatus comprising:
- a resistive memory cell configured to be applied with a command voltage pulse with a different voltage level, depending upon an input command;
- a current control signal generation unit configured to detect a voltage level of the command voltage pulse and output a detection result as a current control signal;
- a compliance current control section configured to detect a formation voltage formed by current which the resistive memory cell passes, based on a first reference voltage and a second reference voltage with a voltage level lower than the first reference voltage, selectively form the pull-down current path according to a detection result, and thereby limit an amount of current which the resistive memory cell passes; and
- is a reference voltage control section configured to raise the voltage level of the second reference voltage higher than a voltage level of the first reference voltage in response to the current control signal.

19. The semiconductor memory apparatus according to claim 18, wherein the resistive memory cell has a unipolar switching characteristic.

20. The semiconductor memory apparatus according to claim 18, wherein the resistive memory cell has a structure in which a polymer substance with a unipolar switching characteristic is interposed between a bottom electrode and a top electrode.

21. The semiconductor memory apparatus according to claim 18, further comprising:
- a voltage pulse generation unit configured to receive the input command and generate the command voltage pulse, wherein the voltage pulse generation unit outputs a writing voltage pulse with a first voltage level if a data writing command is inputted, outputs an erasure voltage pulse with a second voltage level if a data erasure command is inputted, and outputs a reading voltage pulse with a third voltage level if a data reading command is inputted, wherein the first voltage level is higher than the third voltage level and the second voltage level is lower than the third voltage level.

22. The semiconductor memory apparatus according to claim 18, further comprising:

a data sensing unit configured to sense an amount of current which passes through the resistive memory cell and output an output data in response to the data reading command is inputted.

23. The semiconductor memory apparatus according to claim 18, wherein the compliance current control section limits a maximum amount of current, which the resistive memory cell can pass in a first operation cycle in which the data writing command is inputted, to a first compliance current, and limits a maximum amount of current, which the resistive memory cell can pass in a second operation cycle in which the data erasure command is inputted, to a second compliance current with a level higher than the first compliance current.

24. The semiconductor memory apparatus according to claim 18, wherein, under the control of the current control signal, the compliance current control section forms the pull-down current path when an amount of current, which passes through the resistive memory cell, reaches a first target level or forms the pull-down current path when an amount of current, which passes through the resistive memory cell, reaches a second target level higher than the first target level.

25. The semiconductor memory apparatus according to claim 18, wherein the compliance current control section comprises:

a comparison stage configured to compare the first and second reference voltages with the formation voltage respectively; and a pull-up/pull-down driving stage configured to selectively form a pull-up/pull-down current path according to a comparison result of the comparison stage.

26. The semiconductor memory apparatus according to claim 18, wherein the reference voltage control section comprises:

a diode having an anode which receives the current control signal and a cathode which is coupled to an input node of the second reference voltage.

27. The semiconductor memory apparatus according to claim 18, wherein the current control signal generation unit comprises:

comparison sections configured to compare the voltage levels of the first and second reference voltages with the command voltage pulse respectively, and output comparison results as first and second comparison result signals; and an RS latch section configured to output the current control signal under the control of the first and second comparison result signals.

28. A method for driving a semiconductor memory apparatus having a resistive memory cell which performs a unipolar switching operation by receiving a command voltage pulse with a different voltage level depending upon an input command, the method comprising the steps of:

setting a maximum amount of current which the resistive memory cell can pass, as a first compliance current;

performing a data writing operation by applying a writing voltage pulse to the resistive memory cell; and performing a first data verifying operation by applying a reading voltage pulse to the resistive memory cell and sensing an electrical state of the resistive memory cell.

29. The method according to claim 28, further comprising:

setting a maximum amount of current which the resistive memory cell can pass, as a second compliance current with a level higher than the first compliance current;

performing a data erasure operation by applying an erasure voltage pulse to the resistive memory cell; and performing a second data verifying operation by applying a reading voltage pulse to the resistive memory cell and sensing an electrical state of the resistive memory cell.

* * * * *